(12) United States Patent
Kawahara et al.

(10) Patent No.: US 10,629,674 B2
(45) Date of Patent: Apr. 21, 2020

(54) TRENCH ISOLATED CAPACITOR

(71) Applicant: Texas Instruments Incorporated, Dallas, TX (US)

(72) Inventors: Hideaki Kawahara, Plano, TX (US); Binghua Hu, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/379,165

(22) Filed: Apr. 9, 2019

(65) Prior Publication Data

US 2019/0237535 A1 Aug. 1, 2019

Related U.S. Application Data

(62) Division of application No. 15/245,511, filed on Aug. 24, 2016, now Pat. No. 10,290,699.

(51) Int. Cl.
*H01L 49/02* (2006.01)
*H01L 21/283* (2006.01)
*H01L 21/311* (2006.01)
*H01L 21/768* (2006.01)
*H01L 23/535* (2006.01)

(52) U.S. Cl.
CPC ............ *H01L 28/60* (2013.01); *H01L 21/283* (2013.01); *H01L 21/31111* (2013.01); *H01L 21/76895* (2013.01); *H01L 23/535* (2013.01)

(58) Field of Classification Search
None
See application file for complete search history.

(56) References Cited

U.S. PATENT DOCUMENTS

| | | | |
|---|---|---|---|
| 5,315,142 A | 5/1994 | Acovic et al. | |
| 6,297,086 B1 | 10/2001 | Hegde et al. | |
| 10,290,699 B2 * | 5/2019 | Kawahara | H01L 21/283 |
| 2004/0036051 A1 | 2/2004 | Sneh | |
| 2007/0296010 A1 | 12/2007 | Su et al. | |
| 2009/0194844 A1 * | 8/2009 | Richter | H01L 21/743 |
| | | | 257/532 |
| 2009/0289291 A1 | 11/2009 | Cheng | |
| 2010/0276805 A1 | 11/2010 | Tu et al. | |
| 2012/0139080 A1 | 6/2012 | Wang et al. | |
| 2012/0261804 A1 | 10/2012 | Li et al. | |
| 2012/0267759 A1 | 10/2012 | Shroff et al. | |
| 2015/0221718 A1 | 8/2015 | Rhie | |
| 2016/0172314 A1 | 6/2016 | Cheng et al. | |

* cited by examiner

*Primary Examiner* — Thien F Tran
(74) *Attorney, Agent, or Firm* — Jacqueline J. Garner; Charles A. Brill; Frank D. Cimino

(57) ABSTRACT

An integrated trench capacitor and method for making the trench capacitor is disclosed. The method includes forming a trench in a silicon layer, forming a first dielectric on the exposed surface of the trench, performing an anisotropic etch of the first dielectric to expose silicon at the bottom of the trench, implanting a dopant into exposed silicon at the bottom of the trench, forming a first polysilicon layer over the first dielectric, forming a second dielectric over the first polysilicon layer, and forming a second polysilicon layer over the second dielectric to fill the trench.

16 Claims, 5 Drawing Sheets

TRENCH ISOLATED CAPACITOR

CROSS REFERENCE TO RELATED APPLICATIONS

This application is a divisional of U.S. Nonprovisional patent application Ser. No. 15/245,511, filed Aug. 24, 2016, the contents of which is herein incorporated by reference in its entirety.

FIELD OF THE DISCLOSURE

Disclosed embodiments relate generally to the field of semiconductor processing. More particularly, and not by way of any limitation, the present disclosure is directed to a trench isolated capacitor.

BACKGROUND

There is a demand for high density capacitance in some integrated circuits. Trench capacitors are good candidates, but they come with additional costs, such as one or more extra process masks and additional flows. In circuits that already have trench structures, e.g., substrate contacts, the addition of trench capacitors to existing flows adds to the existing complexity in order to avoid impacting the existing trench structures. An improved method of integrating high density capacitors into existing flows is desired.

SUMMARY

Disclosed embodiments disclose a high density trench capacitor that can be formed simultaneously with a substrate contact that is formed in a deep trench structure. A method of making the trench capacitor is also disclosed using an existing process for creating substrate contacts. Utilizing an existing process means that integration of the capacitors requires no new masks and adds only minimal processing to the existing flows.

In one aspect, an embodiment of a method of forming a trench capacitor in a semiconductor wafer is disclosed. The method includes forming a trench in a silicon layer; forming a first dielectric on the exposed surface of the trench; performing an anisotropic etch of the first dielectric to expose silicon at the bottom of the trench; implanting a dopant into exposed silicon at the bottom of the trench; forming a first polysilicon layer over the first dielectric; forming a second dielectric over the first polysilicon layer; and forming a second polysilicon layer over the second dielectric to fill the trench.

In another aspect, an embodiment of an integrated trench capacitor is disclosed. The integrated trench capacitor includes a first dielectric that lines a deep trench in a semiconductor; a first polysilicon layer overlying the first dielectric, wherein the first polysilicon layer is shorted to the semiconductor at the bottom of the deep trench; a second polysilicon layer that fills a central portion of the deep trench, the second polysilicon layer being separated from the first polysilicon layer by a second dielectric; a first contact that provides electrical connectivity to the first polysilicon layer; and a second contact that provides electrical connectivity to the second polysilicon layer.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1A-9A depict the process of forming a trench capacitor according to an embodiment of the disclosure;

FIGS. 1B-9B depict the process of forming a substrate contact simultaneously with forming the capacitor of FIGS. 1A-9A;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 12:
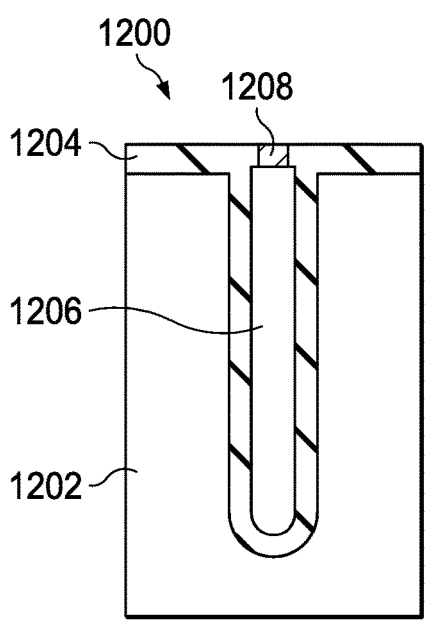
FIG. 12 depicts a trench capacitor as known in the prior art.

FIG. 12 discloses a trench capacitor 1200 as is known in the art. As seen in this figure, a trench capacitor can be formed in a deep trench that is etched into a doped region 1202 of a semiconductor. Once the trench is formed, a layer of oxide or other dielectric 1204 is formed over the exposed surface of the trench, then the rest of the trench is filled with doped polysilicon 1206 to form capacitor 1200. A contact 1208 is formed to the inner layer of polysilicon while region 1202 is connected to ground through the substrate (not specifically shown). Formation of capacitor 1200 requires a mask to be added to the process, as well as the noted steps. When a substrate contact is desired in the same layout as a capacitor, providing for both of these features at the same time can be difficult.

Figure 1A:
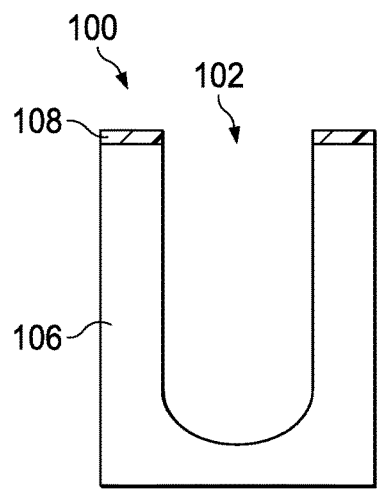
Figure 1B:
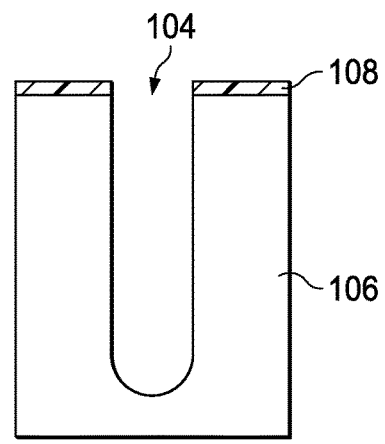

The disclosed capacitor is formed simultaneously with a deep substrate contact, such that integrating the capacitor adds no masks and only two processing steps to the existing flow for forming the substrate contact. Accordingly, the process of forming the two devices will be explained at the same time. FIGS. 1-9 disclose various points in the process of forming the two deep trench structures. At each point, the figure having a suffix of "A" depicts the formation of the trench capacitor while the figure having a suffix of "B" depicts the formation of the substrate contact. As seen in FIGS. 1A-B, trench 102 for a capacitor and trench 104 for a substrate contact are both formed in silicon layer 106, which can be either the substrate of the wafer, an epitaxial layer grown on the substrate or a combination of the two. To form the trenches, a mask layer 108 is formed on silicon layer 106 and patterned with openings over the desired sites for the trenches. In at least one embodiment, the masking layer is a metal-oxide hardmask, such as a Ti, W, and Zr oxide that is deposited in a spin-on process. In another embodiment, the masking layer can be a photoresist. A hardmask may particularly be indicated when the desired depth of the trench capacitor is large.

Etching is performed to create trenches 102 and 104 and mask layer 108 may be removed. In one embodiment, the depth of the trenches is approximately 20 microns. In other embodiments, the depth of the trenches can be in the range of 5 to 70 microns. Although not necessarily visible in these drawings, the diameter or width of trench 102 is greater than the diameter or width of trench 104. It will be recognized that the figures accompanying this application are not necessarily drawn to scale. In one embodiment, trench 102 has a width of approximately 3 microns, while trench 104 has a width of approximately 1 micron. In other embodiments, the width of trench 102 can be in the range of 2 to 10 microns, while the width of trench 104 can be in the range of 1 to 5 microns. As we shall see below, this difference is width makes a large difference in the way various layers are formed in these different trenches.

Figure 2A:
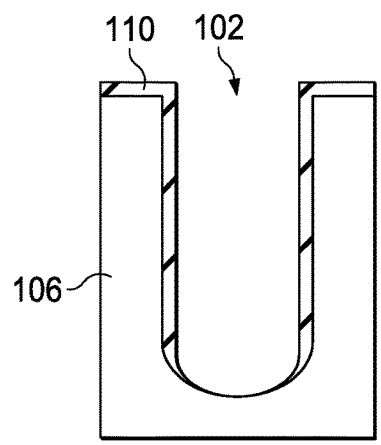
Figure 2B:
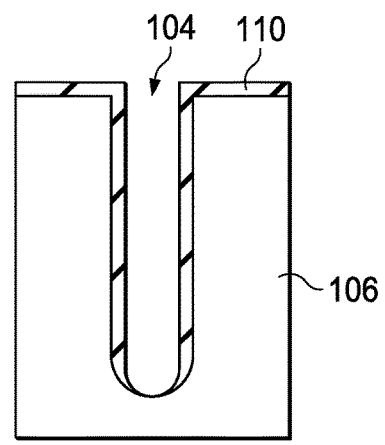
Figure 3A:
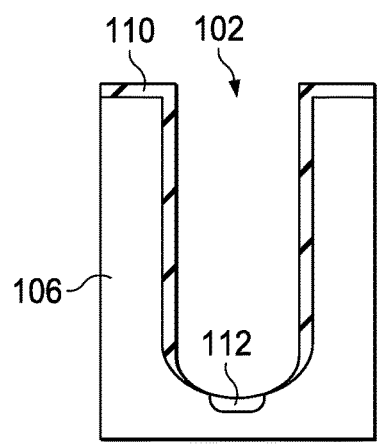
Figure 3B:
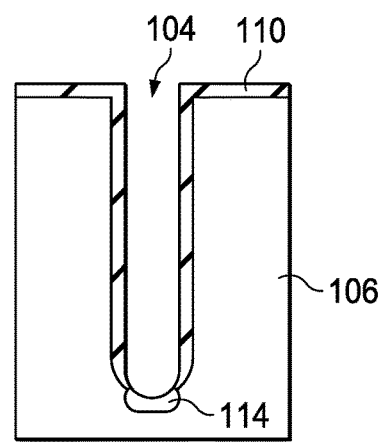

In FIGS. 2A and 2B, a thin thermal oxide is grown on the exposed silicon, followed by sub-atmospheric chemical vapor deposition of silicon oxide to form liner 110. In one embodiment, the thermal oxide is 2000 Å thick. A dry etch, e.g., using Reactive Ion Etch (ME) is performed on trenches 102, 104 to etch through liner 110 at the bottom of the respective trenches to contact silicon layer 106. It will be understood that the reference herein to the "bottom" of the trenches 102, 104 refers to the orientation of the capacitor and substrate contacts as seen in the accompanying figures, i.e., the closed end of the trench. In FIGS. 3A and 3B, a dopant is implanted into the silicon at the bottom of trenches 102, 104 to provide contacts 112, 114 with the substrate. In at least one embodiment, the substrate is P-type and boron is implanted, although other P-type dopants can also be used. In one embodiment, an N-type dopant can be used with an N-type substrate and phosphorus is implanted. In one embodiment, the doping level of contacts 112, 114 is approximately $1-5\times10^{19}/cm^3$. Up to this point, the processing has produced essentially the same results in both structures, but as the process moves forward from here, the different widths of the two trenches cause different results.

Figure 4A:
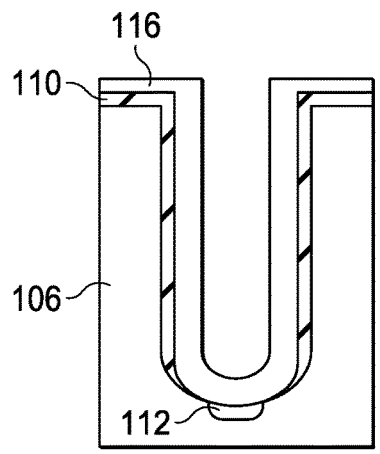
Figure 4B:
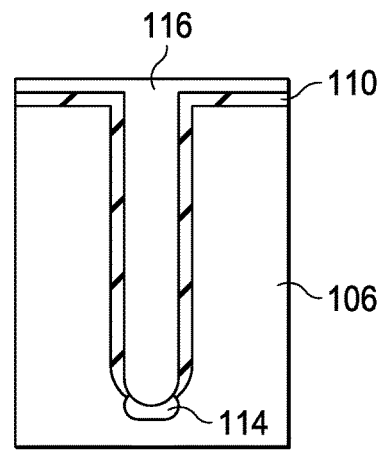
Figure 5A:
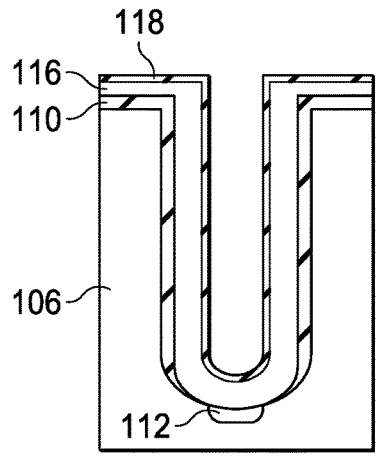
Figure 5B:
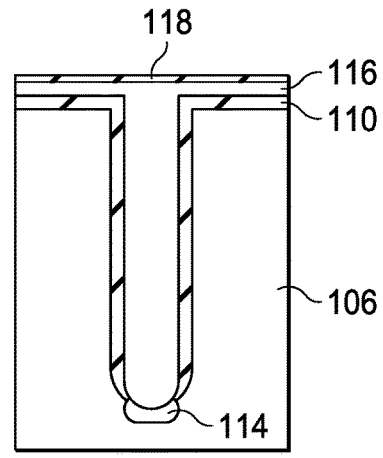

In FIGS. 4A and 4B, a thin, doped polysilicon layer 116 is deposited on the wafer. In one embodiment, polysilicon layer 116 has a thickness of approximately 0.6 microns. This thickness of polysilicon will completely fill trench 104, which has a diameter, e.g., of 1.0 microns, but will only provide a lining on the sides of trench 102, which has a diameter, e.g., of 3 microns. In one embodiment, the doping level of polysilicon layer 116 is approximately $1-5\times10^{19}/cm^3$. In FIGS. 5A and 5B, dielectric layer 118 is deposited on top of polysilicon layer 116. In trench 102, dielectric layer 118 forms a second liner such that polysilicon layer 116 is sandwiched between two dielectric layers, except where polysilicon layer 116 contacts silicon layer 106. Since trench 104 was already filled, dielectric layer 118 is just deposited on the surface over the substrate contact. In one embodiment, dielectric layer 118 is an oxide and is deposited to a thickness of 200 Å. In one embodiment, dielectric layer 118 is an oxide/nitride/oxynitride (ONO) layer having a thickness of approximately 100-1000 Å.

Figure 6A:
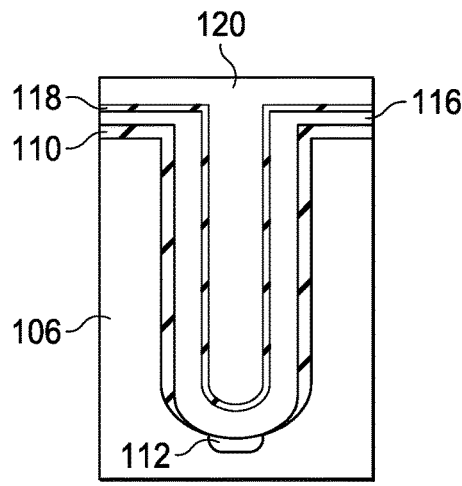
Figure 6B:
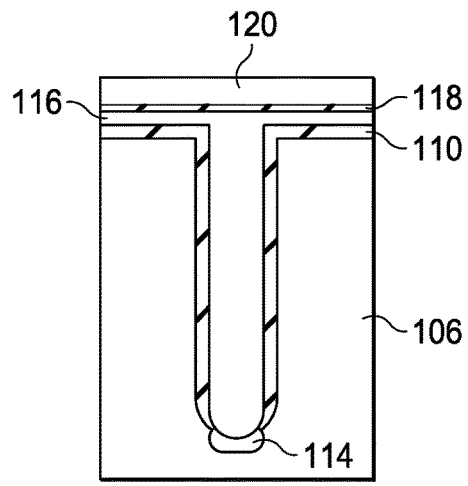
Figure 7A:
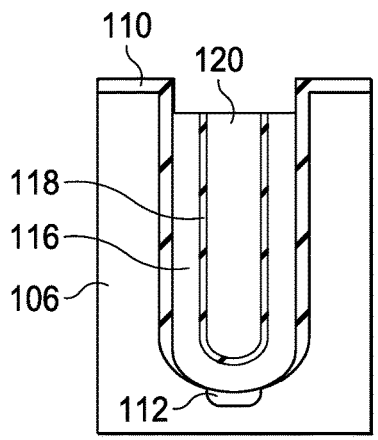
Figure 7B:
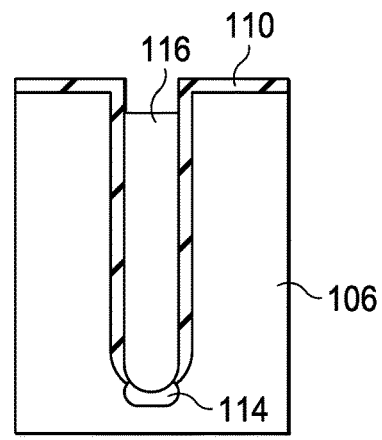
Figure 8A:
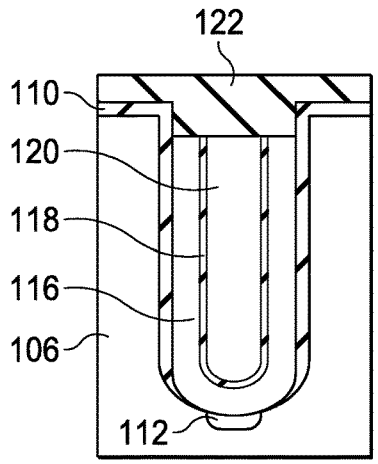
Figure 8B:
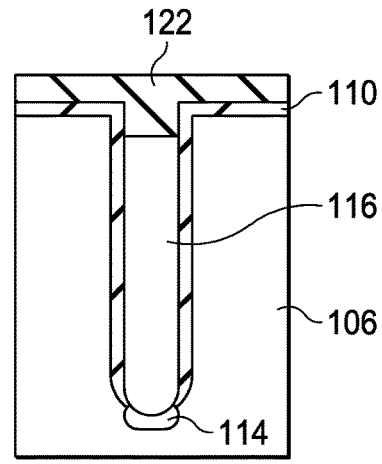
Figure 9A:
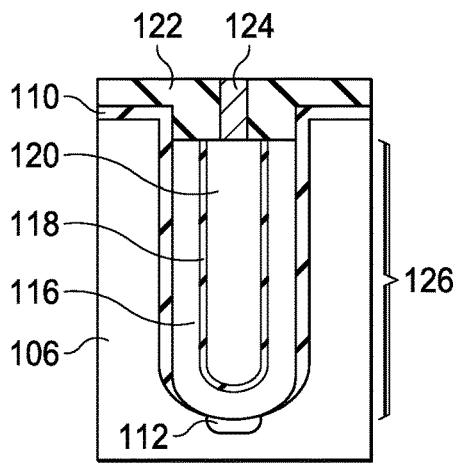
Figure 9B:
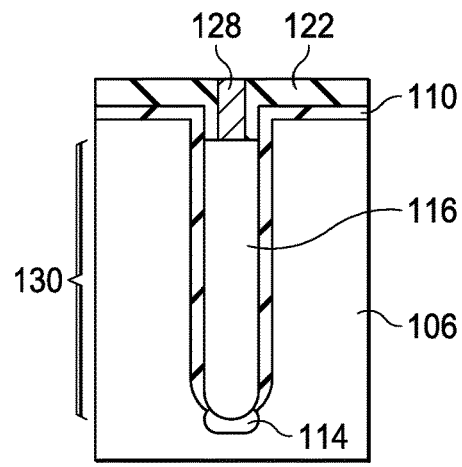

Looking next at FIGS. 6A and 6B, a polysilicon layer 120 is deposited. Polysilicon layer 120 completely fills trench 102 and forms a layer on the surface over trench 104. It will be recognized that the thickness of polysilicon layer 120 can vary, depending on the width of trench 102. In one embodiment, polysilicon layer 120 is 10000 Å thick and has a doping level of approximately $1-5\times10^{19}/cm^3$. In FIGS. 7A and 7B, the surface of the wafer is etched back to remove polysilicon layer 116, dielectric layer 118 and polysilicon layer 120 from the surface of the wafer, leaving the structures seen in these two figures. In FIGS. 8A and 8B, passivation layer 122 is deposited over the chip and in FIGS. 9A and 9B, contact 124 is formed to polysilicon layer 120 of capacitor 126 and contact 128 is formed to substrate contact 130, completing the process as far as these two structures are concerned. Of course, further processing can be performed on the wafer to form structures not shown in this figure.

Figure 10:
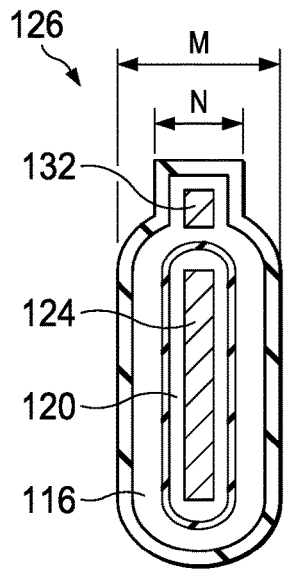
FIG. 10 depicts a top view of a capacitor according to an embodiment of the disclosure.

It can be seen in capacitor 126 that two capacitor plates have been formed, with polysilicon layer 116 forming a bottom plate and polysilicon layer 120 forming a top plate. One skilled in the art will recognize that with polysilicon layer 116 contacting silicon layer 106, polysilicon layer 116 will be grounded and polysilicon layer 120 will have the higher voltage. Notably, we have only shown an external contact to polysilicon layer 120 in the figures so far. There are at least two different methods to provide a contact to polysilicon layer 116. In a first embodiment, a substrate contact 130 is formed next to capacitor 128, so that the substrate contact provides contact to the bottom plate of capacitor 128 through silicon layer 106. A second embodiment is shown in FIG. 10, which depicts a top-down view of capacitor 126. In this embodiment, the main body of capacitor 126 has a width of M, while a neck of capacitor 126 has a width of N. In at least one embodiment, M is equal to 3 microns and N is equal to 0.5 microns. Thus, when polysilicon layer 116 is deposited, the wider body of capacitor 126 receives only a thin layer of doped polysilicon, but the narrower neck is filled completely with doped silicon. When contacts are formed, contact 124 is formed to contact polysilicon layer 120 and a smaller contact 132 is formed to contact polysilicon layer 116.

Figure 11A:
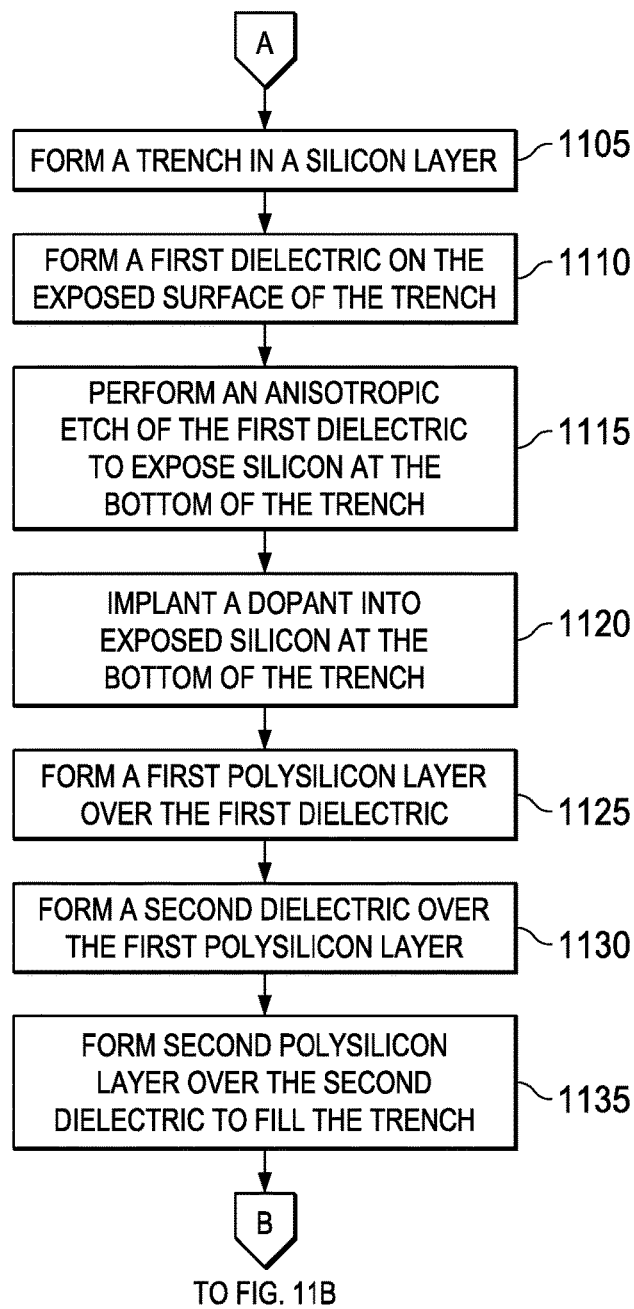
FIGS. 11A-E depict a simplified flowchart for forming an integrated capacitor according to an embodiment of the disclosure.
Figure 11B:
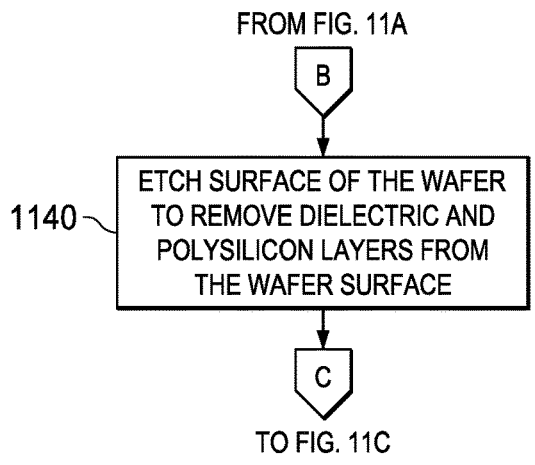
Figure 11C:
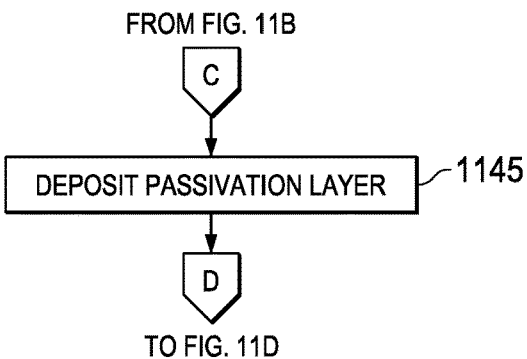
Figure 11D:
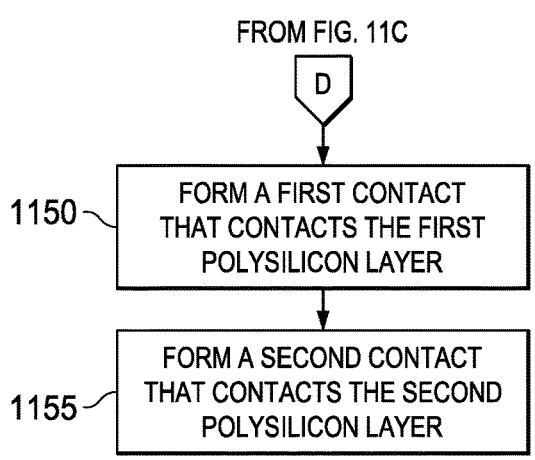
Figure 11E:
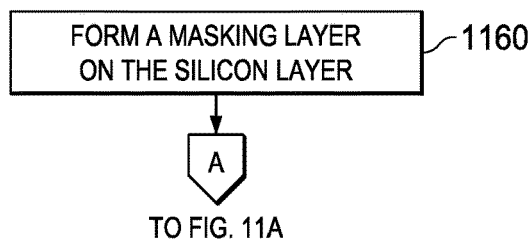

FIGS. 11A-E depict a simplified flowchart for a method of forming a trench capacitor in a semiconductor. The method begins in FIG. 11A with forming (1105) a trench in a silicon layer. After the trench is created, the method forms (1110) a first dielectric on the exposed surface of the trench, then performs (1115) an anisotropic etch of the first dielectric to expose silicon at the bottom of the trench. A dopant is implanted (1120) into the exposed silicon at the bottom of the trench, then a first polysilicon layer is formed (1125) over the first dielectric. A second dielectric layer is formed (1130) over the first polysilicon layer and a second polysilicon layer is formed (1135) over the second dielectric. This second polysilicon layer fills the trench. The method continues in FIG. 11B with etching (1140) the surface of the wafer to remove dielectric and polysilicon layers from the wafer surface. In FIG. 11C, the method continues with depositing (1145) a passivation layer over the wafer surface and in FIG. 11D further continues with forming (1150) a first contact that contacts the first polysilicon layer and forming (1155) a second contact that contacts the second polysilicon layer. In FIG. 11E, prior to forming the trench, the method forms (1160) a masking layer on the silicon layer.

Applicants have disclosed a capacitor that can be integrated with an existing flow that forms substrate contacts in a trench. In at least one embodiment, the disclosed capacitor adds no new masks and only two additional steps to the existing process, i.e., forming dielectric layer 118 and polysilicon layer 120.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit comprising:
   a silicon layer of a substrate; and
   a trench capacitor formed in the silicon layer, the trench capacitor comprising:
      a first portion of a first dielectric that lines a first trench in the silicon layer,
      a first portion of a first polysilicon layer overlying the first portion of the first dielectric, wherein the first portion of the first polysilicon layer contacts a first doped region of the silicon layer at a bottom of the first trench, and
      a second polysilicon layer that fills a central portion of the first trench, the second polysilicon layer being separated from the first polysilicon layer by a second dielectric;
   a substrate contact in a second trench in the silicon layer, the substrate contact comprising:
      a second portion of the first dielectric that lines the second trench,
      a second portion of the first polysilicon layer that fills a central portion of the second trench, the second portion of the first polysilicon layer shorted to the silicon layer at a bottom of the second trench by a second doped region of the silicon layer.

2. The integrated circuit of claim 1, wherein the first polysilicon layer and the second polysilicon layer are recessed from a top surface of the first trench.

3. The integrated circuit of claim 2, wherein the first polysilicon layer is recessed from a top surface of the second trench.

4. The integrated circuit of claim 3, further comprising a passivation layer over the first polysilicon layer and the second polysilicon layer.

5. The integrated circuit of claim 4, further comprising a first contact extending through the passivation layer to contact the second polysilicon layer of the first trench.

6. The integrated circuit of claim 5, further comprising a second contact extending through the passivation layer to contact the second portion of the first polysilicon layer in the second trench.

7. The integrated circuit of claim 1, wherein the second trench is narrower than the first trench.

8. The integrated circuit of claim 1, wherein no portion of the second polysilicon layer extends into the second trench.

9. The integrated circuit of claim 1, wherein the second dielectric comprises an oxide/nitride/oxynitride (ONO) layer.

10. The integrated circuit of claim 1, wherein the silicon layer, the first doped region, and the second doped region are all the same conductivity type.

11. An integrated circuit comprising:
    a substrate; and
    an integrated trench capacitor formed in the substrate, the integrated trench capacitor comprising:
       a first dielectric that lines a first trench in the substrate,
       a first polysilicon layer overlying the first dielectric, wherein the first polysilicon layer is shorted to the substrate at a bottom of the first trench,
       a second polysilicon layer that fills a central portion of the first trench, the second polysilicon layer being separated from the first polysilicon layer by a second dielectric,
       a first contact that provides electrical connectivity to the first polysilicon layer,
       a second contact that provides electrical connectivity to the second polysilicon layer; and
    a substrate contact formed in a second trench adjacent the integrated trench capacitor.

12. The integrated circuit as recited in claim 11, wherein the first contact is coupled to the substrate contact and the first polysilicon layer fills a central portion of the second trench.

13. The integrated circuit as recited in claim 11, the substrate contact comprising a third dielectric formed in the second trench and a third polysilicon layer overlying the third dielectric, wherein the third polysilicon layer is shorted to the substrate at a bottom of the second trench.

14. An integrated circuit comprising:
    a substrate; and
    an integrated trench capacitor formed in the substrate, the integrated trench capacitor comprising:
       a first dielectric that lines a first trench in the substrate,
       a first polysilicon layer overlying the first dielectric, wherein the first polysilicon layer is shorted to the substrate at a bottom of the first trench,
       a second polysilicon layer that fills a central portion of the first trench, the second polysilicon layer being separated from the first polysilicon layer by a second dielectric,
       a first contact that provides electrical connectivity to the first polysilicon layer, and
       a second contact that provides electrical connectivity to the second polysilicon layer, wherein the first contact is formed in a part of the first polysilicon layer in a narrowed portion of the first trench.

15. The integrated circuit as recited in claim 14, wherein the first trench has a width of approximately three microns.

16. The integrated circuit as recited in claim 15, wherein the narrowed portion of the first trench has a width of approximately one-half micron.

* * * * *